(12) United States Patent
Stejskal et al.

(10) Patent No.: US 7,858,526 B2
(45) Date of Patent: Dec. 28, 2010

(54) METHOD OF PATTERNING GATE ELECTRODES BY REDUCING SIDEWALL ANGLES OF A MASK LAYER

(75) Inventors: Roland Stejskal, Freital (DE); Stephan Kruegel, Reichenberg (DE); Markus Lenski, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 886 days.

(21) Appl. No.: 11/672,329

(22) Filed: Feb. 7, 2007

(65) Prior Publication Data

US 2008/0003825 A1 Jan. 3, 2008

(30) Foreign Application Priority Data

Jun. 30, 2006 (DE) .................. 10 2006 030 262

(51) Int. Cl.
*H01L 21/302* (2006.01)
*C03C 15/00* (2006.01)
(52) U.S. Cl. ........................................ 438/689; 216/41
(58) Field of Classification Search ................ 438/689, 438/978; 257/E21.206, E29.255; 216/41, 216/58
See application file for complete search history.

(56) References Cited

U.S. PATENT DOCUMENTS

| 6,323,093 | B1 | 11/2001 | Xiang et al. ................. 438/299 |
| 6,406,950 | B1* | 6/2002 | Dakshina-Murthy ........ 438/183 |
| 6,818,519 | B2 | 11/2004 | Fang et al. ................... 438/301 |
| 2004/0002217 | A1* | 1/2004 | Mazur et al. ................. 438/696 |
| 2004/0065976 | A1* | 4/2004 | Sreenivasan et al. ...... 264/171.1 |
| 2005/0164478 | A1* | 7/2005 | Chan et al. ................... 438/585 |
| 2005/0191832 | A1* | 9/2005 | Huang et al. ................. 438/585 |

* cited by examiner

*Primary Examiner*—Binh X Tran
*Assistant Examiner*—Patti Lin
(74) *Attorney, Agent, or Firm*—Williams, Morgan & Amerson, P.C.

(57) ABSTRACT

By performing an anisotropic resist modification prior to the actual resist trimming process, the profile of the end portions of the resist features may be significantly enhanced, for instance by providing substantially vertical sidewall portions. Consequently, an overlap of gate electrodes with the respective isolation structures may be obtained, while nevertheless the probability for a short circuit between opposing end portions of the gate electrodes may be significantly reduced, thereby providing the potential for further scaling down device dimensions.

17 Claims, 9 Drawing Sheets

METHOD OF PATTERNING GATE ELECTRODES BY REDUCING SIDEWALL ANGLES OF A MASK LAYER

BACKGROUND OF THE INVENTION

1. Field of the Invention

Generally, the present disclosure relates to the field of fabrication of integrated circuits, and, more particularly, to the patterning of lines, such as gate electrodes, of field effect transistor devices on the basis of a mask layer, such as a resist mask.

2. Description of the Related Art

In modern ultra-high density integrated circuits, device features are steadily decreased to enhance device performance and functionality. One important circuit element in complex integrated circuits is a field effect transistor, which represents a component having a channel region, whose conductivity may be controlled by an electric field that is generated by applying a control voltage to a gate electrode formed near the channel region and separated therefrom by a gate insulation layer. The channel region is generally defined by respective PN junctions formed by an interface of highly doped drain and source regions and an inversely doped region located between the drain and source regions. Important characteristics for the performance of an integrated circuit are, among others, the switching speed of the individual transistor elements and the drive current capability. Thus, one important aspect for obtaining a high transistor performance is the reduction of the overall resistance of the current path defined by the channel region, the resistance of the drain and source regions and the respective contacts that connect the transistor with peripheral devices, such as other transistors, capacitors and the like. The reduction of the channel length thus provides reduced resistance of the channel region and also offers the potential to increase the packing density of the integrated circuit. Upon reducing the transistor dimension, the transistor width is also typically reduced in view of packing density and switching speed, which may, however, reduce the drive current capability. It is therefore of great importance to reduce the series resistance of a transistor for given design dimensions as much as possible so as to combine moderately high drive current capability with increased switching speed for sophisticated logic circuits.

As previously explained, the channel length and the channel width are critical parameters for the performance of a specified field effect transistor. With reference to FIGS. 1a-1c, a typical conventional process flow will now be described in more detail in order to more clearly demonstrate the problems associated with the patterning of a gate electrode of highly advanced transistor elements.

FIG. 1a schematically illustrates a semiconductor device 100 in a top view, which comprises a substrate 101, which may have formed thereon any appropriate semiconductor material, such as silicon and the like. A trench isolation structure 102 is formed in the substrate 101, i.e., in the respective semiconductor layer so as to define a first active semiconductor region 110 and a second active semiconductor region 120. It should be appreciated that the term "active semiconductor region" is to be understood as describing a semiconductor area including certain dopants, at least in certain portions of the active region, in order to provide a desired conductivity of the region. The first and second active semiconductor regions 110, 120 may substantially represent a respective semiconductor area, in which respective drain and source regions as well as channel regions of a transistor have been formed or will be formed. Furthermore, a first gate electrode 111 is formed above the first active semiconductor region 110 and extends, at least according to the design requirements, with an end portion 111e over the trench isolation 102. Similarly, a second gate electrode 121 is formed above the second active semiconductor region 120 and extends with a respective end portion 121e partially over the trench isolation 102.

FIG. 1b schematically illustrates a sectional view as indicated in FIG. 1a of the semiconductor device 100 at an early manufacturing stage for forming the first and second gate electrodes 111, 121. As illustrated, the device 100 comprises the trench isolation 102 separating the respective active regions 110 and 120. Moreover, a gate electrode material 103 may be formed above the regions 110, 120 and the trench isolation 102, wherein a gate insulation layer 104 is provided between the gate electrode material 103 and the respective active regions 110, 120. Furthermore, in this manufacturing stage, respective resist features 115 and 125 may be formed above the first and second active regions 110, 120, respectively, wherein the respective resist features 115, 125 may be separated by a spacing 130. Furthermore, as is illustrated, an anti-reflective coating (ARC) 106 may be formed between the gate electrode material 103 and the respective resist features 115, 125. It should be appreciated that, in the manufacturing stage shown in FIG. 1b, the resist features 115, 125 may be similar to the respective gate electrodes 111, 121 to be formed from the gate electrode material 103, wherein, however, the respective lateral dimensions may be significantly greater compared to the actual design dimensions of the gate electrodes 111, 121. That is, typically gate electrodes and many other components of transistor elements are patterned on the basis of photolithography techniques in which a corresponding pattern is imaged from a reticle into a resist layer, which is then developed and used as an etch mask for subsequently patterning an underlying material. In sophisticated applications, typically the resolution of the photolithography process is significantly less compared to the actual target dimensions of critical features, such as the gate electrodes 111, 121. For example, in highly sophisticated photolithography techniques, an actual dimension, for instance a width of a line feature, may range between approximately 90-100 nm, while the actual target dimension for a correspondingly patterned line feature may be 60 nm or even less. Consequently, a further reduction in size of the resist features 115, 125 may be necessary, as will be explained later on.

A typical process flow for forming the semiconductor device 100 as shown in FIG. 1b may comprise the following processes. After forming the respective trench isolations 102 on the basis of well-established photolithography, etch, deposition and planarization techniques, the gate insulation layer 104 may be formed on the basis of established oxidation and/or deposition processes. For instance, silicon dioxide, possibly in combination with silicon nitride, are frequently used dielectric materials for advanced field effect transistors, wherein a thickness may range from approximately 1.5-5.0 or more nm, depending on design and device requirements. Thereafter, the gate electrode material 103, typically polysilicon, may be deposited on the basis of well-established low pressure chemical vapor deposition (CVD) techniques, wherein a thickness of the material 103 may range from approximately 80-150 nm for devices of the above-specified critical dimensions. Thereafter, the ARC layer 106 may be formed, for instance by well-established plasma enhanced or thermal CVD techniques, followed by the deposition of any appropriate resist material, selected on the basis of the exposure wavelength used during the subsequent photolithography process. Next, the resist material may be treated in accordance with well-established recipes and may be exposed in order to form a respective exposure pattern in the resist layer that substantially corresponds to the respective circuit features to be formed from the layer 103, except for the lateral dimensions. After the photolithography process, which may comprise additional bake and other post-exposure process steps, the semiconductor device 100 as shown in FIG. 1b may be subjected to a further trim process in order to reduce the size of the resist features 115, 125 resulting from the previous photolithography process.

FIG. 1c schematically illustrates the semiconductor device 100 during a resist trim process 107, which is designed to reduce the lateral dimensions of the resist features 115, 125 in accordance with process requirements so as to obtain reduced features 115R, 125R which may then serve as etch masks for patterning the gate electrode material 103. The trim process 107 is designed as an isotropic etch process, for instance on the basis of oxygen including a plurality of halides and/or fluorine, since oxygen may provide a highly isotropic behavior for a plurality of polymer materials. Thus, the length and width and, due to the isotropic nature of the process 107, the height of the initial features 115, 125 may be significantly reduced in order to obtain the desired target values for the length and width of the reduced features 115R, 125R. Consequently, during the trim process 107, the initial spacing 130 is also significantly increased, as is indicated by 130R. It should be appreciated that the transistor width direction in FIG. 1c corresponds to the horizontal direction, indicated as W, while the transistor length direction is substantially perpendicular to the drawing plane of FIG. 1c. Hence, an increase of the spacing 130R represents a reduction in width of the respective features 115R, 125R, and a reduction in size in the direction perpendicular to the drawing plane corresponds to a reduction of the gate length.

After the resist trim process 107, an anisotropic etch process may be performed in order to transfer the size and shape of the resist features 115R, 125R into the underlying layers 106 and 103. For example, when polysilicon is used, a plasma-based etch process using chlorine, hydrogen bromide and oxygen as reactive gases may be employed. Depending on the characteristics of the respective etch process, a further reduction in size of the resist features 115R, 125R may result and may therefore also reduce the etch fidelity, which may possibly result in reduced overlap of the respective gate electrodes and the trench isolation 102, which may be undesirable with respect to transistor performance.

FIG. 1d schematically illustrates the semiconductor device 100 after the corresponding anisotropic etch process, thereby forming the first and second gate electrodes 111, 121. As is well known, the gate electrode of a field effect transistor may control the conductivity of a respective channel region 113, 123 that forms below the gate insulation layer 104 upon application of an appropriate control voltage to the respective gate electrodes 111, 121. In the sectional view, the flow direction of charge carriers within the channel regions 113, 123 is substantially perpendicular to the drawing plane, while the horizontal extension of the respective channel regions 113, 123 corresponds to the width of the respective channels. Hence, for a specified channel length and for otherwise identical transistor configurations, an increased channel width may result in an increased drive current capability. Consequently, for a given transistor configuration, it is important for optimizing transistor performance to substantially completely "use" the available channel region, which may also require an appropriate electric field at edge regions 124, 114 of the respective channel regions 113, 123.

As is illustratively shown in FIG. 1d, the gate electrode 121, due to tolerances of the preceding patterning process, may have substantially no overlap at the edge region 124, while the gate electrode 111 may have an appropriate overlap with the isolation trench 102, which may be advantageous with respect to the creation of an appropriate electric field at the edge region 114. Consequently, during operation, substantially the whole channel 113 including the edge region 114 is available for charge carrier transport, while a sufficient electrical field for building up a conductive channel at the edge region 124 in the channel region 123 may be reduced. Consequently, reduced transistor performance may result from a non-overlapping gate electrode. As is shown in FIG. 1c, reducing the initial spacing 130, which may be advantageous with respect to transistor performance, may be less than desirable in the conventional process flow, since the resist trim process 107 may then result in respective resist residues in the spacing 130R, which may in turn yield respective residues of the polysilicon material 103, thereby possibly forming a short circuit between the gate electrodes 111 and 121. Consequently, in the conventional gate patterning process as previously described, a compromise is to be made between a desired overlap of the gate electrode with the isolation structure and the avoidance of any short circuits between adjacent opposing end portions, which are also referred to as end caps, of different gate electrodes.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that enables the patterning of semiconductor lines, such as gate electrodes, with increased efficiency by enhancing the profile of an end portion of a mask feature that is formed above an isolation structure. Based on the enhanced profile of the mask feature, respective end portions of the semiconductor line, for instance of the gate electrode, may be patterned with enhanced fidelity, thereby providing the potential for further device scaling without reducing transistor performance due to misaligned gate electrodes or short circuits between opposing end caps of gate electrodes. The enhancement of the profile of respective end portions of a mask feature may be accomplished by significantly reducing the tapering of the respective mask features, as is typically encountered in the conventional resist trim processing, so that a reduced spacing between respective end portions may be used as target values substantially without increasing the probability for creating respective short circuits.

According to one illustrative embodiment disclosed herein, a method comprises forming a mask feature above a first active semiconductor region and a portion of an isolation structure separating the first active semiconductor region from a second active semiconductor region. Furthermore, the tapering of an end portion of the mask feature is reduced and subsequently the lateral dimensions of the mask feature are reduced to form a reduced mask feature. Finally, a material layer formed below the mask feature is patterned on the basis of the reduced mask feature.

According to another illustrative embodiment disclosed herein, a method comprises forming an end portion of a first mask feature and an end portion of a second mask feature above an isolation structure of a semiconductor device. The method further comprises performing an anisotropic modification process for modifying a profile of the end portions of the first and the second mask features. Finally, a lateral dimension of the first and second mask features is adjusted to a specified target value.

According to yet another illustrative embodiment disclosed herein, a semiconductor device comprises an isolation structure formed in a semiconductor layer, wherein the isolation structure separates a first active semiconductor region and a second active semiconductor region which are formed in the semiconductor layer. Furthermore, a first gate electrode is formed above the first active semiconductor region and has a first end portion formed above the isolation structure. Furthermore, a second gate electrode is formed above the second active semiconductor region and has a second end portion formed above the isolation structure, wherein the first and second end portions face each other and define a spacing therebetween, wherein the spacing is less than approximately a length of the first and second gate electrodes.

BRIEF DESCRIPTION OF THE DRAWINGS

The disclosure may be understood by reference to the following description taken in conjunction with the accompanying drawings, in which like reference numerals identify like elements, and in which.

Figure 1A:
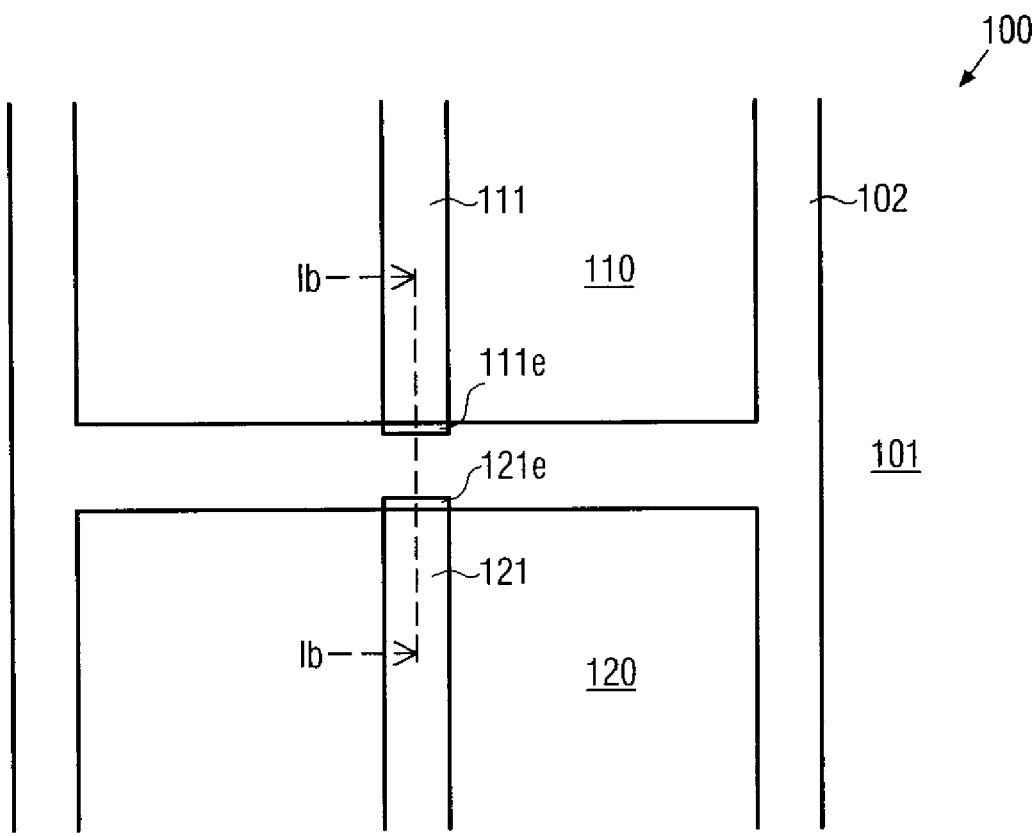
FIG. 1a schematically illustrates a top view of a conventional advanced semiconductor device including first and second transistor regions and respective gate electrodes with opposing end portions at or near an isolation trench.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for the patterning of gate electrodes or other semiconductor lines, which are partially formed above respective isolation structures, wherein opposing end portions, also referred to as end caps, may be positioned more precisely so as to reliably overlap with the isolation structure, thereby significantly reducing process tolerances during the patterning process. Consequently, the reliable overlap of the end portions of the gate electrodes provides enhanced transistor performance, while the reduced process tolerances offer the potential for further device scaling, since the opposing end portions may be provided with a reduced spacing substantially without increasing the probability for forming a direct contact between opposing end portions. For this purpose, a highly anisotropic modification of corresponding mask features, such as resist features, used for patterning of the respective gate electrode material may be performed in order to improve the profile of the end portions, for instance by significantly reducing the tapering thereof, prior to isotropically treating the respective mask features for defining the final lateral target dimensions. In some aspects, the mask feature may be provided in its pre-form, by photolithography, while in other illustrative embodiments, the respective mask feature or any pre-form thereof may be formed by sophisticated imprint techniques, wherein a subsequent anisotropic treatment may provide the desired profile at the respective end portions of the mask features. It should be appreciated that the subject matter disclosed herein is highly advantageous in the context of sophisticated transistor elements having gate lengths of approximately 100 nm and significantly less (e.g. approximately 50 nm or less), since, in this case, a variation of drive current capability due to a non-reliable overlap of end portions of gate electrodes may significantly contribute to overall device variations, while the increased probability for creating shorts between adjacent end portions may reduce production yield.

Figure 1B:
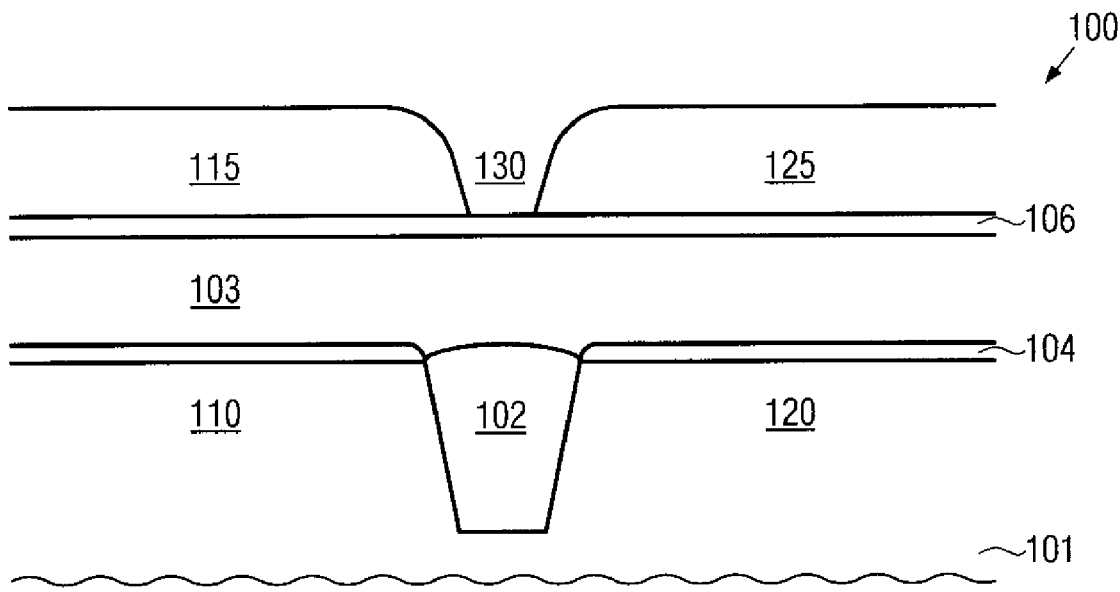
FIGS. 1b-1d schematically illustrate cross-sectional views along the transistor width direction during various manufacturing stages of the device of FIG. 1a according to a conventional process flow.
Figure 1C:
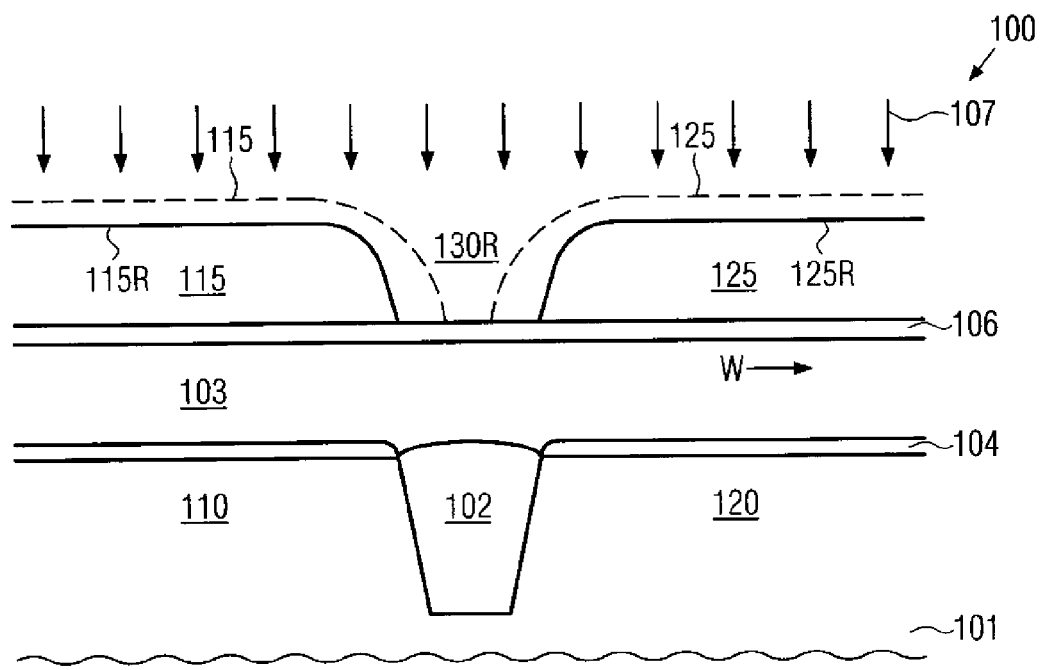
Figure 1D:
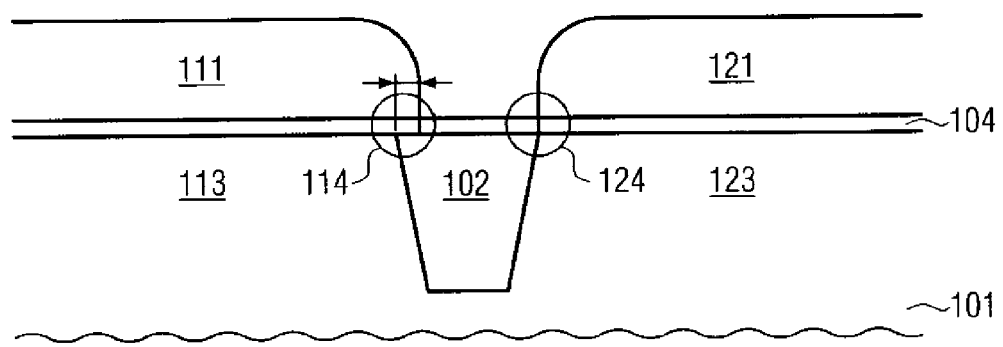
Figure 2A:
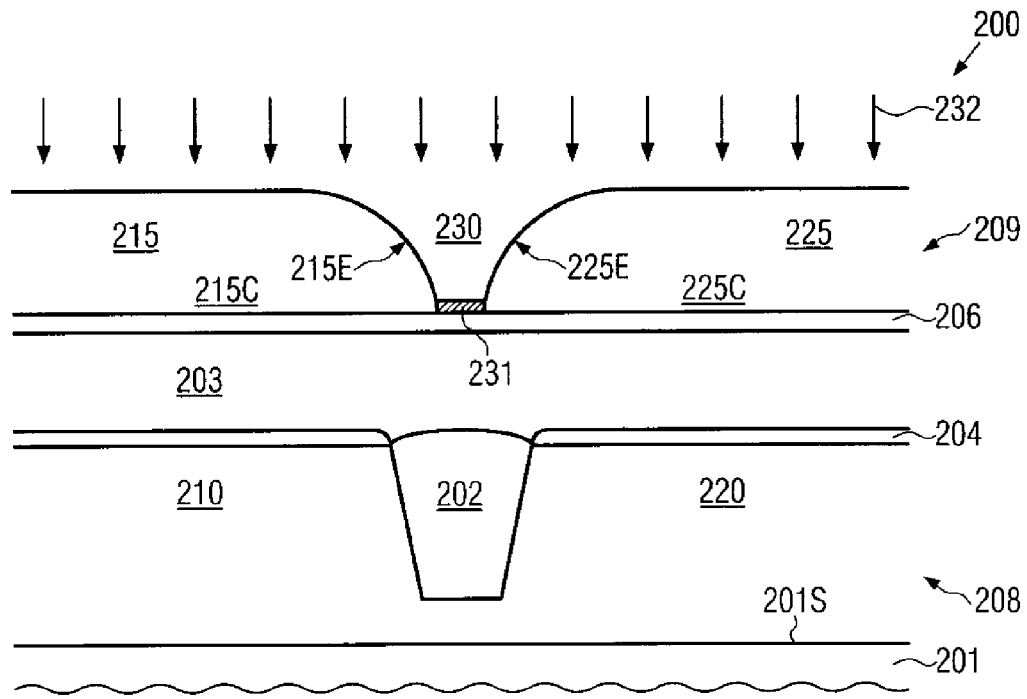
FIGS. 2a-2d schematically illustrate cross-sectional views along the transistor width direction during various manufacturing stages for anisotropically modifying a resist mask for patterning gate electrodes in accordance with illustrative embodiments disclosed herein.

FIG. 2a schematically illustrates a cross-sectional view of a transistor element 200 prior to patterning respective gate electrodes. It should be appreciated that the cross-sectional view of FIG. 2a illustrates a section along a transistor width direction, similarly as is explained with reference to FIGS. 1a-1b. The semiconductor device 200 may comprise a substrate 201 representing any appropriate carrier material having formed thereon a suitable semiconductor layer 208, such as a silicon-based layer, a silicon/germanium layer, a silicon/carbon layer and the like. The substrate 201 may also comprise other appropriate semiconductor materials, such as II-VI, III-V compounds and the like, in which appropriate transistor elements may have to be formed. In other illustrative examples, the substrate 201 may represent a silicon-on-insulator (SOI) substrate wherein the semiconductor layer 208 may be formed on a buried insulating layer (not shown). The semiconductor layer 208 may comprise a first active semiconductor region 210 and a second active semiconductor region 220, which may be separated by a respective isolation structure 202. The isolation structure 202 may represent any appropriate structure, such as a trench isolation structure, which may also be frequently referred to as a shallow trench isolation (STI). The isolation structure 202 may be substantially comprised of an insulating material, at least at an interface between the first and second active regions 210, 220.

Furthermore, a gate insulation layer 204 may be formed on the active regions 210, 220 and, depending on the process strategy, on the isolation structure 202. Furthermore, a gate electrode material 203 and, if required, any appropriate anti-reflective coating (ARC) layer or other material layer 206, which may also include a plurality of sub-layers, depending on process requirements, may be formed above the gate insulation layer 204. It should be appreciated that the layer 206 may also be provided to act as a hard mask during the further processing of the device 200, depending on the process strategy.

Furthermore, a respective mask layer 209, which may, in one embodiment, be provided in the form of a resist layer, is formed above the gate electrode material 203 and is, in the manufacturing stage as shown in FIG. 2a, patterned into respective mask features 215 and 225, which may correspond, except for the lateral dimensions, to respective gate electrodes to be patterned from the gate electrode material 203. As previously explained, the mask features 215, 225 may be obtained on the basis of advanced photolithography techniques, resulting in a feature size having dimensions significantly greater than the desired target dimensions. The respective photolithography process may be performed on the basis of respective process parameters, such as exposure dose and the like, or on the basis of a modified lithography mask such that a spacing 230 between respective end portions 215E, 225E of the mask features 215, 225 may be significantly reduced compared to the conventional approach, thereby reliably positioning the end portions 215E, 225E above the isolation structure 202 and also offering the potential for reducing process tolerances in adjusting the final spacing between respective gate electrodes to be patterned on the basis of the mask features 215, 225. It should be appreciated that, due to the reduced spacing 230, an increased probability for respective resist residues 231 at a bottom of the spacing 230 may exist, wherein, however, the respective resist residues 231 may be reliably removed during the subsequent processing of the resist layer 209.

The semiconductor device 200 as shown in FIG. 2a may be formed on the basis of substantially the same process techniques as previously described, except for the lithography process for patterning the resist layer 209 in order to obtain the reduced spacing 230 compared to the conventional strategy. Thereafter, the device 200 may be subjected to a modification process 232 in order to modify the characteristics of the mask features 215, 225 in an anisotropic manner, i.e., in this case in a highly selective fashion for providing a different etch behavior at the end portions 215E, 225E compared to the central portions 215C, 225C in a subsequent etch step. For instance, the modification process 232 may comprise a highly anisotropic bombardment on the basis of appropriate particles or radiation, i.e., the respective particles or radiation are supplied with a high directionality so that the respective bombardment impinges in a substantially perpendicular fashion with respect to the surface of the central portions 215C, 225C. In this respect, it should be appreciated that any statements with respect to directions or positions are to be understood as relative positions, wherein the substrate 201 may be understood as a reference. That is, any positional statement, such as "above," "below," "lateral," "vertical" and the like, are to be understood with reference to the substrate 201 and in particular to a surface 201S thereof. Hence, the gate electrode material 203 is located "above" the active regions 210, 220 in the above-defined sense. Similarly, the gate insulation layer 204 is formed "on" the respective active regions 210, 220.

Consequently, when substantially perpendicularly hitting the surface of the center portions 215C, 225C, the particles or radiation may modify the material of the mask features 215, 225 differently in the center portion 215C as compared to the end portions 215E which may have received a pronounced tapering during the preceding photolithography and subsequent post-exposure treatments, as is previously described with reference to FIG. 1b. For example, the treatment 232 may represent a radiation hardening, for instance on the basis of appropriately selected ultraviolet (UV) wavelengths, or may represent an electron bombardment, a particle bombardment in the form of an ion implantation and the like.

Figure 2B:
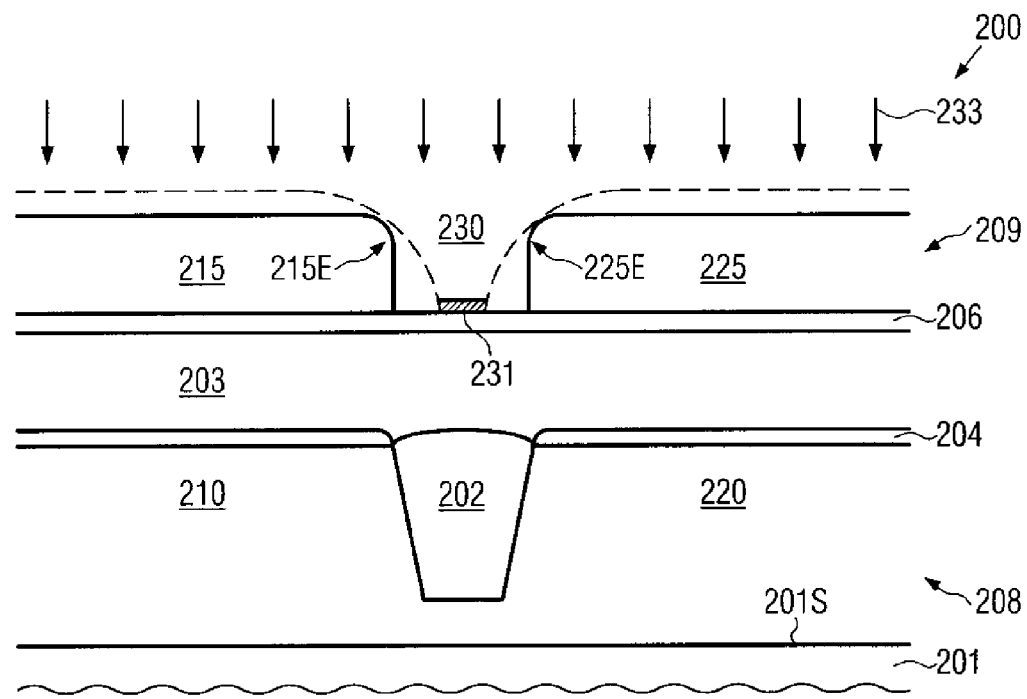

FIG. 2b schematically illustrates the semiconductor device 200 in a further advanced manufacturing stage, wherein the device 200 is exposed to an anisotropic etch process 233 in order to modify the profile at least in the end portions 215E, 225E so as to significantly reduce the tapering therein. For instance, the anisotropic etch process 233 may be designed on the basis of well-established processes, wherein the preceding surface modification 232 may provide a reduced etch rate during the process 233 so that less modified portions, such as the tapered portions of the end portions 215E, 225E, may be removed with a higher etch rate during the process 233 compared to the surface of the center portions 215C, 225C. Appropriate anisotropic etch recipes may be readily established on the basis of a fluorine-based reactive gas including respective polymer components so as to adjust the degree of anisotropy of the process 233. Furthermore, during the anisotropic etch process 233, respective residues 231, which may have experienced a moderately high modification during the treatment 232, may nevertheless be efficiently isolated and may then be removed, for instance during the process 233 or during a subsequent isotropic etch process that is typically performed in order to reduce the lateral dimensions of the mask features 215, 225 in accordance with design targets. Consequently, the respective end portions 215E, 225E may receive a highly modified profile with a significantly reduced tapering, while a reduction in height of the mask features 215, 225 may be less compared to a lateral material removal at the foot of the end portions 215E, 225E.

Figure 2C:
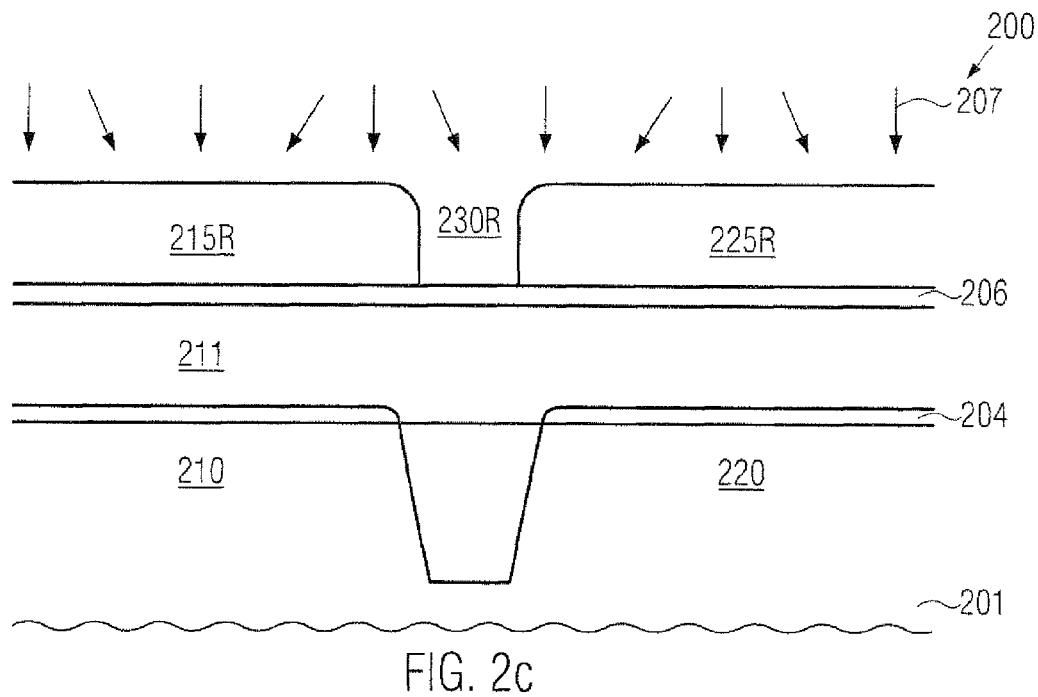

FIG. 2c schematically illustrates the semiconductor device 200 during an isotropic trim process 207, which may be performed on the basis of an oxygen plasma ambient in order to appropriately reduce the lateral extension of the features 215, 225. Due to the substantially vertical resist profile after the preceding processes 232 and 233, the corresponding resist trim process at the end portions 215E, 225E may be slowed down, thereby also providing reduced spacing 230R after the isotropic etch process 207 compared to the conventional strategy. Consequently, in combination with the reduced spacing 230, compared to conventional strategies, the combined processes 232 and 233 provide reduced tapering and thus an enhanced profile of the end portions 215E, 225E, which will result in the spacing 230R after the process 207, which may have a significantly reduced extension compared to conventional processes. As previously explained, the conventional mask features 115, 125 may be recessed more intensively during the respective resist trim process, thereby typically resulting in a spacing of approximately two times the length of the respective resist features 115R, 125R. Contrary thereto, the spacing 230R may be significantly reduced, for instance may be less than a length of the features 215R, 225R, that is, a dimension in a direction perpendicular to the drawing plane of FIG. 2c, thereby providing a reliable overlap of respective gate electrodes with the isolation structure 202.

Figure 2D:
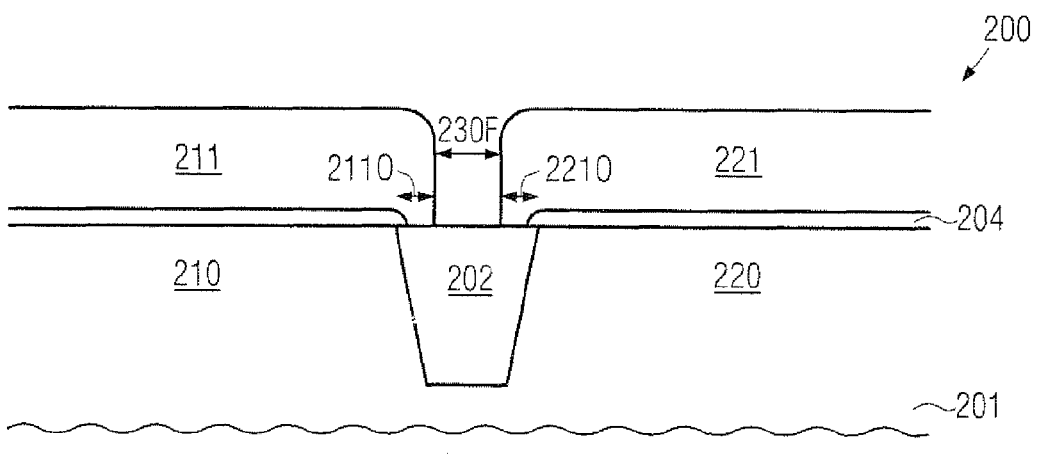

FIG. 2d schematically illustrates the semiconductor device 200 in a further advanced manufacturing stage. A first gate electrode 211 is formed above a portion of the first active region 210 and provides a reliable overlap 211O with the isolation structure 202. Similarly, a second gate electrode 221 is formed above a portion of the second active region 220 and provides a reliable overlap portion 221O with the isolation structure 202. Moreover, a final spacing 230F between the respective end portions 211E, 221E may be reduced, compared to typical conventional devices, wherein, in some illustrative embodiments, the spacing 230F, as measured at the foot of the respective end portions 211E and 221E, may approximately correspond to a length of the respective gate electrodes 211, 221, i.e., the dimension perpendicular to the drawing plane of FIG. 2d of the gate electrodes 211, 221, and may even be less than the corresponding gate length. Consequently, the subject matter disclosed herein provides the potential of device scaling, substantially without significantly negatively affecting production yield, that may be caused by possible short circuits between opposing gate electrodes 211, 221, and enhanced device performance, since a reliable overlap, i.e., the overlap portions 211O, 221O, may be achieved.

With reference to FIGS. 3a-3b and 4a-4f, further illustrative embodiments will now be described, in which the selectivity of a corresponding modification of resist features in view of a central portion and an end portion thereof may be enhanced by providing a sacrificial material layer for covering end portions of the corresponding resist features.

Figure 3A:
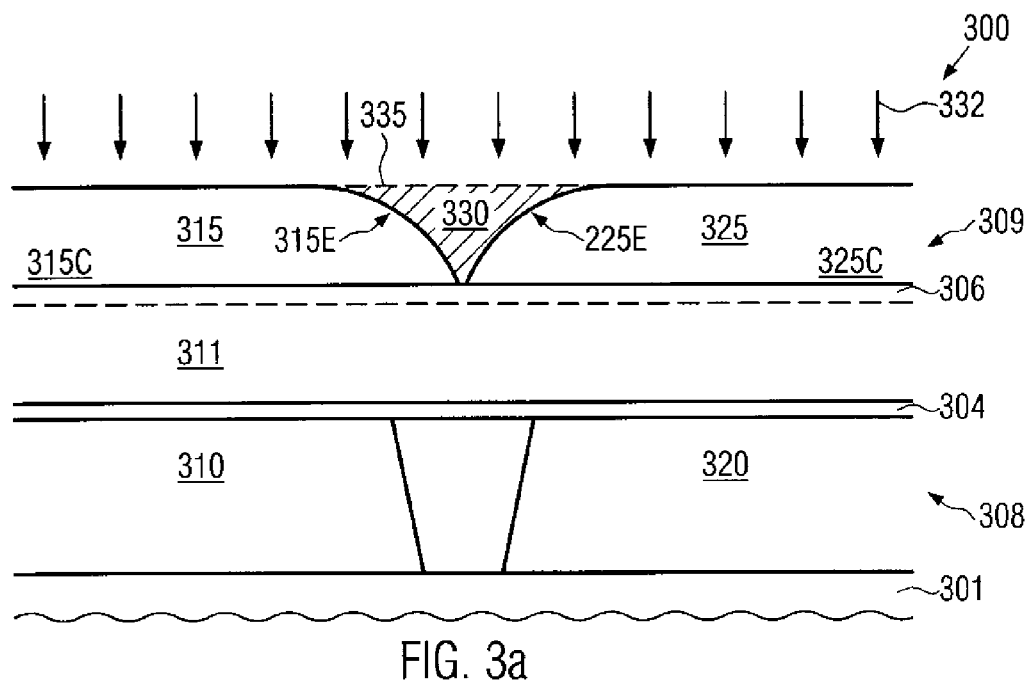
FIGS. 3a-3b schematically illustrate cross-sectional views of a semiconductor device during the patterning of gate electrodes in an anisotropic modification process by covering a spacing between opposing resist features in accordance with further illustrative embodiments disclosed herein.

FIG. 3a schematically illustrates a semiconductor device 300, including a substrate 301 having formed thereon a semiconductor layer 308, in which may be defined a first active region 310 and a second active region 320, separated by an isolation structure 302. A gate insulation layer 304 may be formed on the regions 310, 320 and possibly on the isolation structure 302, depending on process strategies. Furthermore, a gate electrode material 311 may be formed on the gate insulation layer 304 and, if required, a further layer 306 may be formed thereon, which may provide desired optical characteristics, etch characteristics and the like. A mask layer 309, comprising, in this manufacturing stage, a first mask feature 315 and a second mask feature 325, may be formed above the gate electrode material 311, wherein respective end portions 315E, 325E may exhibit a significant tapering due to previously performed lithography processes. Regarding any components of the device 300, it may also be referred to the device 100 and 200 previously described. Furthermore, a sacrificial layer 335, which may also be referred to as a planarization layer, may be formed so as to substantially completely fill a spacing 330 between the respective end portions 315E, 325E. It should be appreciated that the sacrificial layer 335 may also be formed adjacent to the mask features 315, 325 with respect to the length direction, i.e., perpendicularly to the drawing plane of FIG. 3a. In the embodiment illustrated, the sacrificial layer 335 may be formed so as to expose the surface of central portions 315C, 325C for a subsequent surface modification process 332. As previously described, when referring to the modification process 232, a high selectivity is obtained by using the sacrificial layer 335, which may significantly reduce the effect of the treatment 332 on the material of the end portions 315E, 325E wherein, for example, lower portions of the end portions 315E, 325E may receive the smallest amount of "treatment," while upper portions may be modified more intensively. As previously discussed, the treatment 332 may represent a radiation hardening process, or any other surface modification process for modifying the etch characteristics of the exposed portions of the features 315, 325.

The sacrificial layer 335 may have different etch characteristics, even after the treatment 332, with respect to the mask features 315, 325, which may be accomplished by selecting an appropriate material, such as polymer material lacking any photochemical capabilities or any other properties resulting in a modified surface structure similarly as the material of the layer 309. In other illustrative embodiments, the sacrificial layer 335 may be different with respect to its removal behavior during a subsequent process, such as an etch process, a heat treatment and the like, so as to enable the selective removal of the sacrificial layer 335 even when modified by the treatment 332. For instance, the material of the sacrificial layer 335 may be comprised of a material having a low melting temperature such that the layer 335 may be selectively removed on the basis of an appropriate wet chemical treatment at elevated temperatures. In other illustrative embodiments, the layer 335 may have a significantly different etch behavior with respect to an appropriately selected etch recipe, which may only insignificantly affect the material of the mask layer 309. The sacrificial layer 335 may be applied by spin-on techniques, which may be followed by appropriate planarization techniques, such as a soft chemical mechanical polishing (CMP) and the like. In other cases, when a sufficient etch selectivity between the layer 335 and the resist layer 309 is provided, the layer 335 may be etched back in order to expose the surface of the central portions 315C, 325C.

Figure 3B:
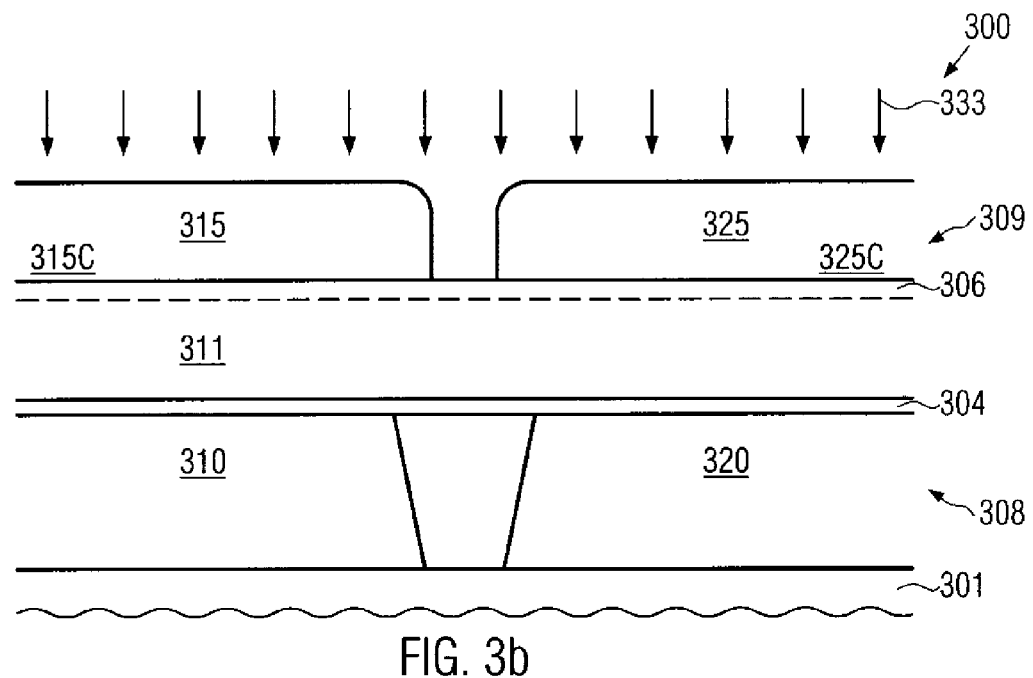

FIG. 3b schematically illustrates the semiconductor device 300 after the treatment 332 and the removal of the sacrificial layer 335. Furthermore, the device 300 is subjected to an etch process 333, which, in some illustrative embodiments, may be designed as a substantially anisotropic etch process, thereby efficiently removing non-treated or slightly treated material from the end portions 315E, 325E due to the reduced treatment thereof during the preceding process 332. Consequently, a significant reduction of the tapering at the end portions 315E, 325E is accomplished, wherein respective sidewalls may even become substantially vertical. Thereafter, a further isotropic etch process may be performed in order to reduce the lateral dimensions of the mask features 315, 325, as is previously explained. Hence, also in this case, a highly efficient anisotropic treatment of the respective end portions 315E, 325E may be accomplished by means of the process 332 in combination with the sacrificial layer 335 and the subsequent anisotropic etch process 333. Thereafter, the further processing may be continued as is also described with respect to the device 200 in order to form respective gate electrodes on the basis of mask features 315, 325 having the improved profile at the end portions 315E, 325E.

FIGS. 4a-4f schematically illustrate a process sequence similar to the sequence described above with reference to FIGS. 3a-3b, which may, additionally or alternatively, be applied to a hard mask layer for enhancing the profile of end portions thereof.

Figure 4A:
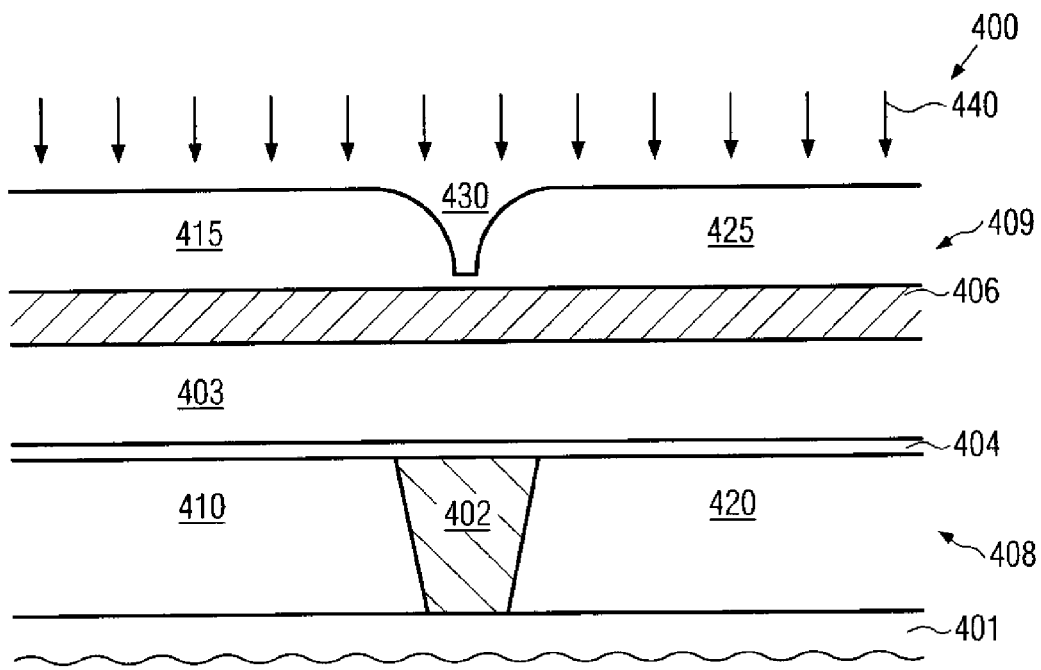
FIGS. 4a-4f schematically illustrate cross-sectional views of a semiconductor device during various manufacturing stages in patterning gate electrodes, wherein a hard mask layer is anisotropically modified for enhancing the profile of end caps of gate electrodes according to further illustrative embodiments disclosed herein.

FIG. 4a schematically illustrates a semiconductor device 400 comprising a substrate 401 having formed thereon a semiconductor layer 408 in which are defined a first active region 410 and a second active region 420 by an isolation structure 402. A gate insulation layer 404 may be formed on the first and second active regions 410, 420 followed by a gate electrode material 403 having formed thereon a hard mask layer 406 comprised of any appropriate material, such as nitrogen-enriched silicon dioxide, silicon nitride, silicon dioxide and the like. Furthermore, a resist layer 409 may be formed above the layer 406 and may be patterned so as to include a first resist feature 415 and a second resist feature 425, wherein a respective spacing 430 defined by respective end portions 415E and 425E may be selected moderately small compared to conventional strategies, to provide a reduced final spacing with a reliable overlap of the respective gate electrodes. With respect to any characteristics of the components of the device 400, the same criteria apply as previously explained for the corresponding components in the devices 100, 200 and 300. Furthermore, the device 400 is subjected to an anisotropic etch process 440 for patterning the hard mask layer 406. It should be appreciated that the moderately disadvantageous profile at the end portions 415, 425 may therefore also have been transferred into the hard mask layer 406, which may then be "enhanced" by the subsequent processing as will be described later on. In some illustrative embodiments, the profile of the end portions 415E, 425E may be enhanced prior to the etch process 440 on the basis of a process technique as described with reference to FIGS. 3a-3b.

Figure 4B:
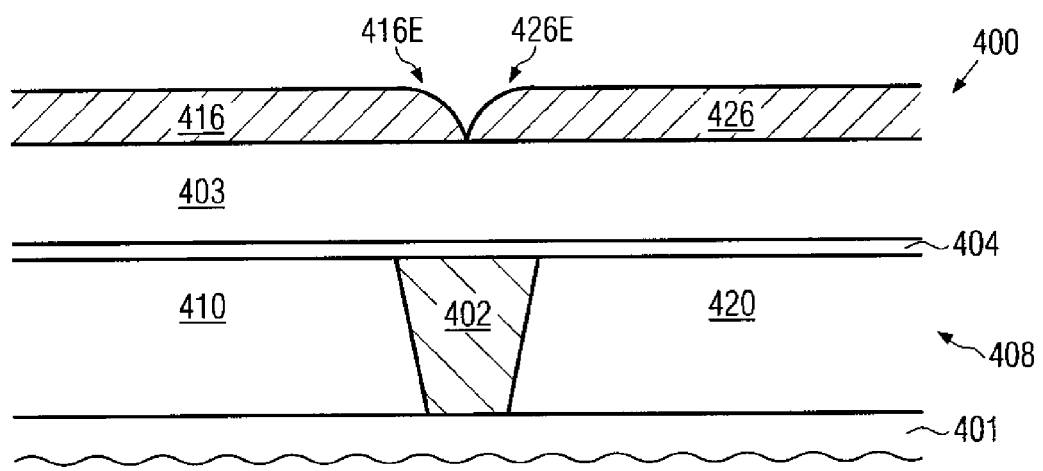

FIG. 4b schematically illustrates the device 400 after the end of the etch process 440 and the removal of the respective resist layer 409. Consequently, the mask layer 406 comprises a first mask feature 416 and a second mask feature 426 having respective end portions 416E, 426E.

Figure 4C:
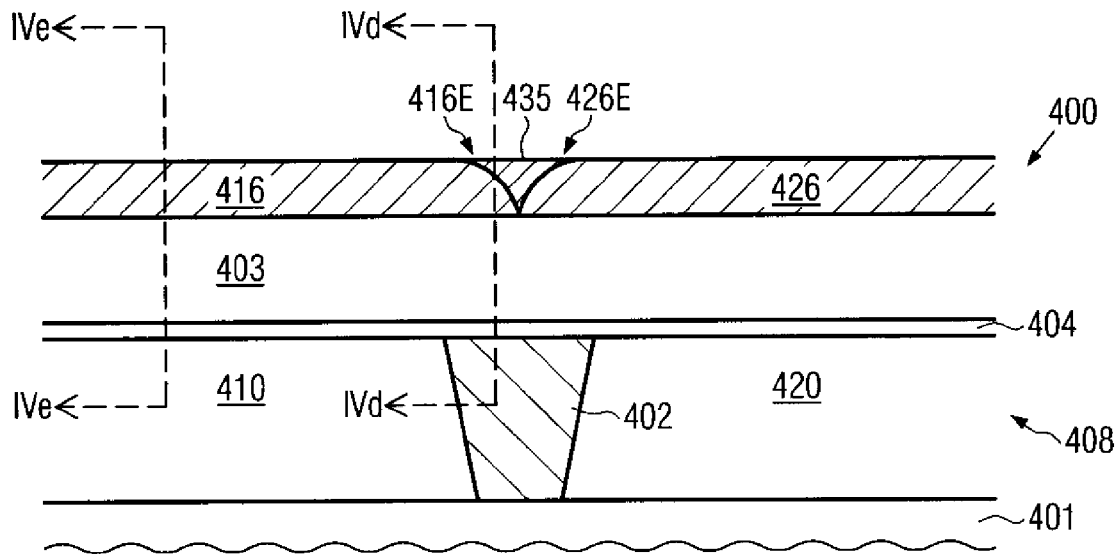

FIG. 4c schematically illustrates the device 400 in a further advanced manufacturing stage, in which a sacrificial layer 435 is formed so as to substantially completely fill the space between the end portions 416E, 426E. The sacrificial or planarization layer 435 may have different characteristics with respect to the mask layer 406 in at least one aspect, for instance in its etch behavior, so that the sacrificial layer 435 may be selectively removed with respect to the material of the mask layer 406. Regarding the formation of the sacrificial layer 435, the same criteria apply as previously explained with reference to the layer 335.

Figure 4D:
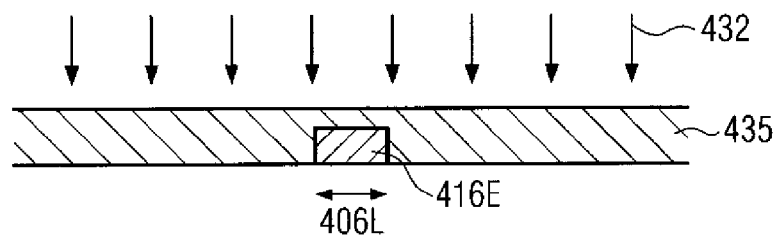

FIG. 4d schematically illustrates a cross-sectional view of the device 400 as indicated in FIG. 4c. Thus, the end portion 416E of the first mask feature 416 is covered beginning from a specific height, as indicated by the section of FIG. 4c, with material of the sacrificial layer 435. Moreover, it should be appreciated that a lateral dimension of the end portion 416E, indicated as 406L in FIG. 4d, may substantially correspond to a gate length, when the resist features 415, 425 have previously been subjected to an appropriate resist trim process so as to obtain the desired design value of gate electrodes to be patterned from the gate electrode material 403. In other cases, the length 406L may not correspond to the finally desired gate length, since a further trim process may be performed for the mask features 416 and 426 in a later manufacturing stage. Moreover, the device 400 may be subjected to a modification process 432, which may include a surface treatment, for instance a nitridation process affecting the materials of the layer 435 and the mask features 416, 426 in a different manner. For example, the process 432 may result in an enhanced etch resistivity of exposed portions of the mask features 416, 426 in a specified etch process. In still other illustrative embodiments, the modification process 432 may comprise the deposition of a thin layer, which may be subsequently selectively removed during the removal of the sacrificial layer 435, thereby maintaining the previously deposited thin layer on the respective mask features 416, 426, while removing the layer from the end portions 416E, 426E along with the respective material of the sacrificial layer 435. For example, the sacrificial layer 435 may be provided as a highly volatile material, when heated to elevated temperatures, thereby providing the desired behavior.

Figure 4E:
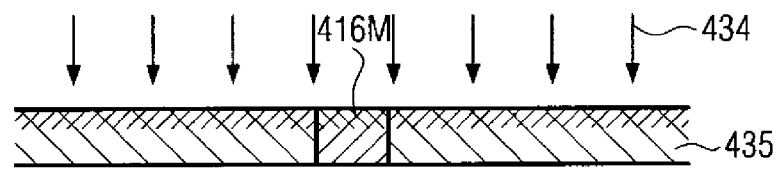
Figure 4E:
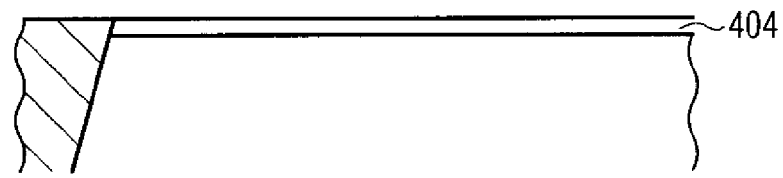

FIG. 4e schematically illustrates a cross-sectional view as indicated in FIG. 4c for an exposed portion of the mask feature 416 after the modification process 432, thereby creating a respective modified portion 416M. Furthermore, the device 400 may be subjected to a selective removal process 434 so as to remove the sacrificial layer 435 substantially selectively to the mask features 416 and 426. As previously explained, the different material characteristics of the mask features 416, 426 with respect to the sacrificial layer 435 may be efficiently taken advantage of in order to obtain a high selectivity during the process 434.

Figure 4F:
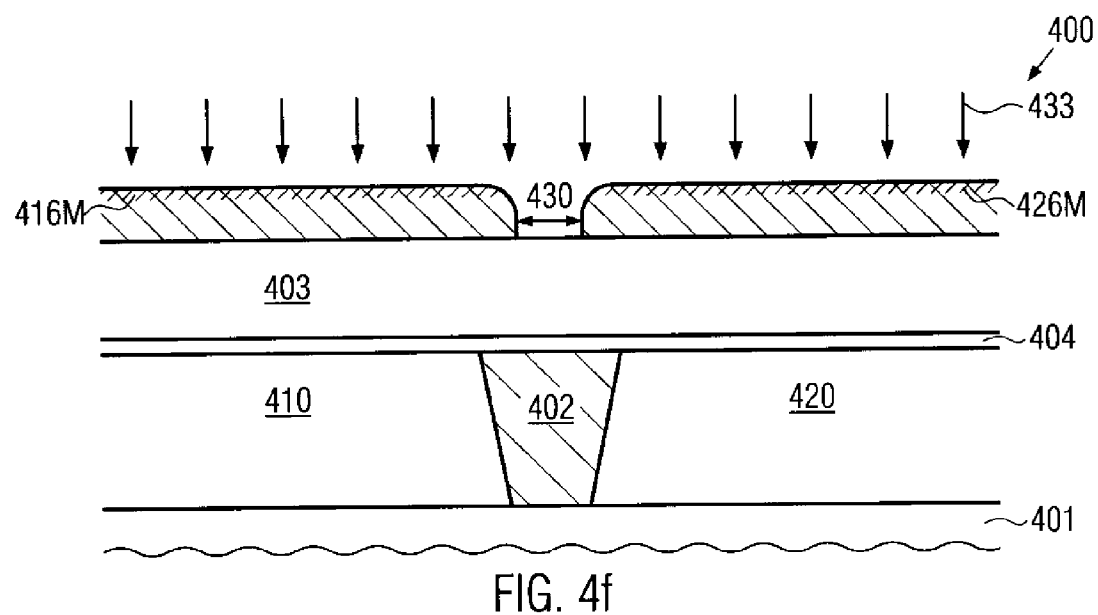

FIG. 4f schematically illustrates the device 400 after the completion of the removal process 434, wherein it should be appreciated that the cross-section is now again taken along the transistor width direction, as is also illustrated in FIGS. 4a-4c. The device 400 is exposed to an etch ambient 433 for removing material with enhanced selectivity due to the modified portions 416M, 426M at the central portions, while the respective end portions 416E, 426E may lack the corresponding modification and thus may be removed more efficiently during the process 433. Consequently the process 433, which may be designed as an anisotropic etch process, may result in a significantly enhanced profile of the end portions 416E, 426E with a significantly reduced tapering so that a corresponding spacing 430 may be obtained that provides a reliable overlap while nevertheless ensuring a reliable exposure of the gate electrode material 403 in a subsequent anisotropic etch process for patterning the material 403 on the basis of the mask features 416, 426. It should be appreciated that during or after the process 433, a further trim process may be performed to reduce the lateral dimensions of the mask features 416, 426 in order to obtain a desired target gate length. Consequently, the respective gate length may substantially correspond to the length 406L (FIG. 4c), or may even be reduced, when a respective further trim process is performed.

Figure 5A:
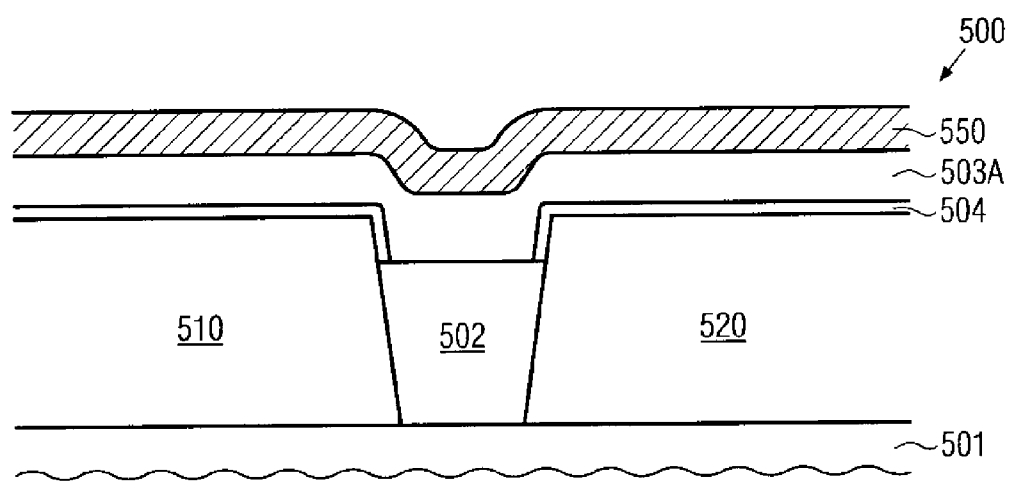
FIGS. 5a-5c schematically illustrate cross-sectional views of a semiconductor device during the patterning of gate electrodes, wherein an isolation trench is recessed in order to selectively modify the optical characteristics according to yet other illustrative embodiments disclosed herein.
Figure 5B:
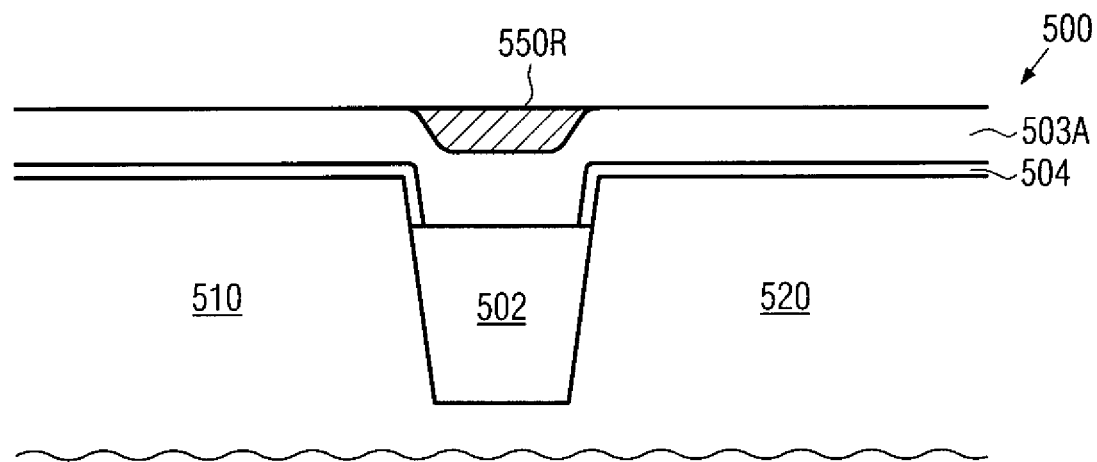
Figure 5C:
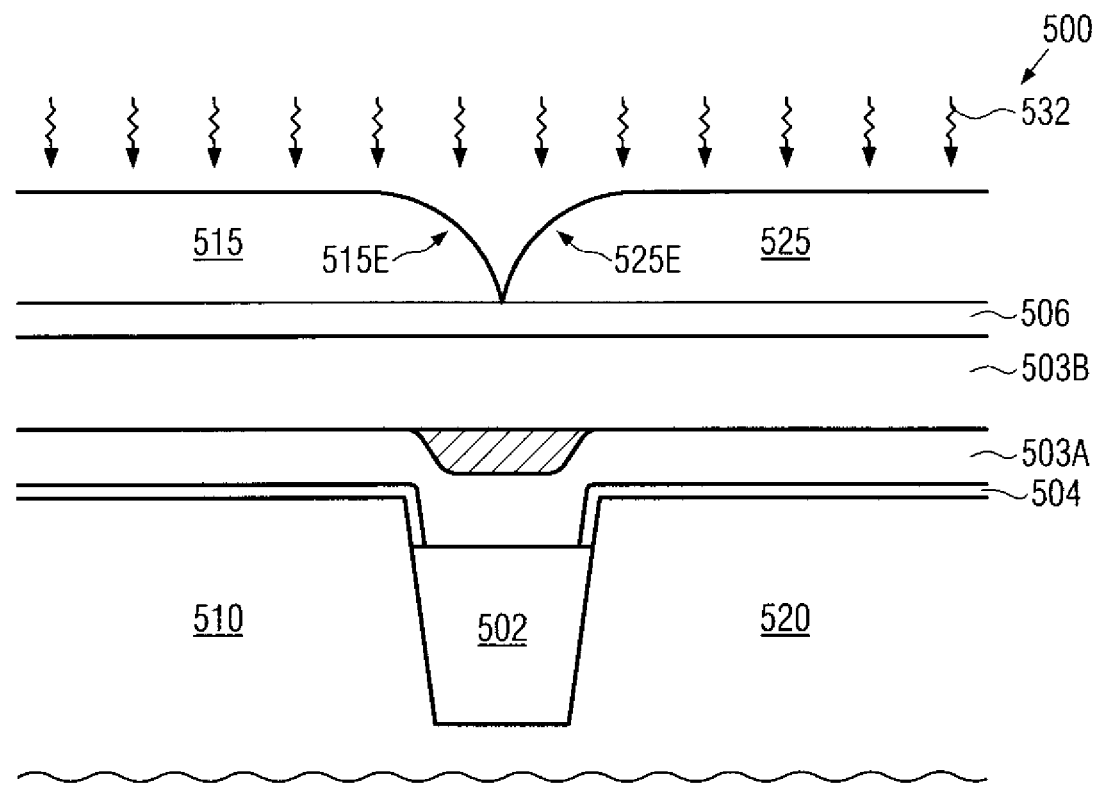

With reference to FIGS. 5a-5c, further illustrative embodiments will now be described wherein an optical behavior above the isolation structure is modified during the formation of the gate electrode material in order to provide a high selectivity during a respective modification process.

FIG. 5a schematically illustrates a semiconductor device 500 comprising a substrate 501, including a semiconductor layer 508, in which is defined a first active region 510 and a second active region 520 by an isolation structure 502, which is provided in the form of a trench isolation. In the embodiment illustrated, the trench isolation structure 502 may be recessed, i.e., a corresponding insulating material may not extend up to the surface defined by the active regions 510, 520. Moreover, a gate insulation layer 504 may be formed on the active regions 510, 520 and at sidewall portions of the recess in the trench isolation structure 502. Furthermore, a first portion of gate electrode material 503A may be conformally formed above the gate insulation layer and the recessed isolation trench 502. Furthermore, a material layer 550 having specified optical characteristics may be formed on the layer portion 503A. The material layer 550 may have optical characteristics in a subsequent radiation hardening process so as to reduce the effect thereof locally above isolation trench 502 or in other cases may significantly enhance the effect of any irradiation irradiated during a modification process, as will be described later on. The layer 550 may be formed, for instance, of silicon dioxide with a specified amount of nitrogen and the like in order to appropriately adapt the index of refraction and the extinction coefficient.

FIG. 5b schematically illustrates the device 500 in a further advanced manufacturing stage. Here, excess material of the layer 550 has been removed so as to provide a substantially planar surface topography, thereby forming a residue 550R of the material of the layer 550. For instance, the respective planarization may be accomplished by CMP and the like. Thereafter, the further processing may be continued by further depositing gate electrode material in order to obtain the desired target thickness, and any ARC layers or hard mask layers may be formed, if required, followed by a photolithography process for providing a respective resist mask.

FIG. 5c schematically illustrates the device 500 after the completion of the above-described process sequence. Hence, a second layer portion 503B of gate electrode material is formed above the planarized layer 503A, followed by an ARC layer or hard mask layer 506 with respective resist mask features 515, 525 which may have been patterned so as to provide reduced spacing between respective end portions 515E, 525E, as is also previously explained. Moreover, in this manufacturing stage, the device 500 is subjected to a modification process 532, which may be a radiation-based process with an appropriately selected radiation, for instance as provided by a laser source and the like. During the treatment 532, a hardening of the resist features 515, 525 may be obtained, depending on the energy deposited therein, wherein, in one illustrative embodiment, the portion 550R may effectively reduce any radiation energy deposited in the end portions 515E, 525E during the treatment 532. For example, the portion 550R may act in combination with the second layer portion 503B as an "ARC" layer for the radiation of the treatment 532 so that, in combination with the reduced optical absorption behavior due to the tapering of the end portions 515E, 525E, a more pronounced "selectivity" of the treatment 532 may be achieved. Thereafter, the further processing may be continued, as is for instance described with reference to FIGS. 2a-2b, that is, a corresponding etch process may be performed so as to preferably remove material in the end portions 515E, 525E to enhance the profile thereof. Next, a corresponding resist trim process may be performed in order to appropriately pattern the gate materials 503B, 503A. During the actual patterning process for forming the gate electrodes, the corresponding etch process may be temporarily changed upon exposing the portions 550R which may exhibit a significantly different etch rate compared to the gate electrode material, in order to etch through the portion 550R. Thereafter, the etch process may be resumed on the basis of an etch recipe as previously used for efficiently etching the gate electrode material of the layer 503A. Thus, also in this case, a reliable overlap of the respective gate electrodes may be achieved, wherein the initial and the final spacing between the respective end portions 515E, 525E and respective end portions of the gate electrodes may be significantly reduced, thereby providing the potential for further device scaling. Furthermore, due to the recessed isolation trench 502, an increased efficiency of the gate electrodes at the interface to the isolation trench 502 may be achieved, since the electrode material "wraps" around respective edges of the active regions 501, 521, thereby improving the formation of a conductive channel in this area, which may also contribute to an enhanced transistor performance.

As a result, the subject matter disclosed herein enables a significant improvement of the profile at end portions of respective mask features for patterning gate electrodes by applying an anisotropic modification process, which significantly reduces tapering of the respective end portions. To this end, in some illustrative embodiments, the resist features may be treated to form substantially vertical sidewalls at the end portions, which may be accomplished on the basis of modification processes, such as radiation hardening, particle bombardment and the like, while, in other embodiments, an additional sacrificial layer may be used for enhancing the selectivity of the modification process. Also, the respective enhancement of the profile may be obtained by correspondingly modifying end portions of a hard mask, which may be accomplished in a highly efficient manner on the basis of a sacrificial layer. In still other illustrative embodiments, the optical behavior at the isolation trench may be significantly modified so as to also enhance the efficiency of a corresponding resist modification. As a consequence, the end portions of opposing gate electrodes may be positioned with a reduced spacing therebetween compared to conventional strategies, to create a reliable overlap of the end portions and the isolation structures, while nevertheless reducing the risk for forming direct contact between the opposing end portions. It should be appreciated that the enhancement of the respective profiles of the end portions may also be used in combination with improving the respective profile in the gate length direction, if required. That is, the sidewall slopes of respective mask features may be made more vertical, if required, on the basis of the above-described techniques. Furthermore, in some illustrative embodiments, respective mask features, as previously described, may be formed on the basis of imprint techniques, wherein a moldable resist or any other appropriate polymer material may be patterned by imprinting an appropriate imprint die, wherein, in some cases, a negative form of the respective mask feature may be formed first and may finally be filled with an appropriate material, while the respective layer, which has been imprinted, may be selectively removed. In other cases, a moldable mask material may be directly imprinted so as to receive corresponding mask features for gate electrodes, which may then also be treated as described above in order to provide a reliable overlap and isolation between the respective end portions during the subsequent trimming of the mask features.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a mask feature directly above a first active semiconductor region and a portion of an isolation structure separating said first active semiconductor region from a second active semiconductor region;
   reducing a tapering of an end portion of said mask feature;
   reducing lateral dimensions of said mask feature to form a reduced mask feature; and
   patterning a material layer formed below said mask feature on the basis of said reduced mask feature.

2. The method of claim 1, wherein reducing a tapering of said end portion comprises performing an anisotropic modification process.

3. The method of claim 2, wherein performing an anisotropic modification process comprises performing an anisotropic etch process.

4. The method of claim 2, wherein performing an anisotropic modification process comprises selectively covering said end portion of said mask feature while exposing a central portion of said mask feature and modifying at least one characteristic of said central portion.

5. The method of claim 4, wherein selectively covering said end portion comprises forming a planarization layer to cover said end portion having a reduced height.

6. The method of claim 1, wherein said mask feature is used for patterning a gate electrode.

7. The method of claim 6, wherein forming said mask feature comprises performing a lithography process by exposing a resist layer to a specific radiation to form a pattern in said resist layer and forming said mask feature from said pattern.

8. The method of claim 6, wherein forming said mask feature comprises performing a lithography process by imprinting a pattern into a mask layer and forming said mask feature on the basis of said pattern.

9. The method of claim 6, wherein said gate electrode has a target length of approximately 50 nm or less.

10. A method, comprising:
    forming an end portion of a first mask feature and an end portion of a second mask feature directly above an isolation structure of a semiconductor device;
    performing an anisotropic modification process for modifying a profile of said end portions of said first and second mask features; and
    adjusting a lateral dimension of said first and second mask features to a specified target value.

11. The method of claim 10, wherein adjusting said lateral dimension comprises an isotropic etch process.

12. The method of claim 10, wherein said anisotropic modification process comprises performing an anisotropic etch process.

13. The method of claim 10, further comprising forming, on the basis of said first and second mask features, a first gate electrode above a first active region and a second gate electrode above a second active region, said first and second active regions being separated by said isolation structure.

14. The method of claim 10, wherein said mask feature is a resist feature.

15. The method of claim 10, wherein said mask feature is a hard mask feature.

16. The method of claim 10, wherein said anisotropic modification process comprises selectively covering said end portions of said first and second mask features and modifying a surface of an exposed central portion of said first and second mask features.

17. The method of claim 16, further comprising forming a planarization layer so as to expose said central portions and to cover said end portions and removing said planarization layer selectively to said mask feature after modifying said surface.

* * * * *